US008147928B2

(12) United States Patent  
Ulion

(10) Patent No.: US 8,147,928 B2
(45) Date of Patent: Apr. 3, 2012

(54) REDUCED THERMAL CONDUCTIVITY THERMAL BARRIER COATING BY ELECTRON BEAM-PHYSICAL VAPOR DEPOSITION PROCESS

(75) Inventor: Nicolas E. Ulion, Marlborough, CT (US)

(73) Assignee: United Technologies Coporation, Hartford, CT (US)

( * ) Notice: Subject to any disclaimer, the term of this patent is extended or adjusted under 35 U.S.C. 154(b) by 175 days.

(21) Appl. No.: 12/415,106

(22) Filed: Mar. 31, 2009

(65) Prior Publication Data

US 2009/0305866 A1   Dec. 10, 2009

Related U.S. Application Data

(62) Division of application No. 11/149,054, filed on Jun. 8, 2005, now abandoned.

(51) Int. Cl.
   *C23C 14/30* (2006.01)
(52) U.S. Cl. ........ 427/596; 428/472; 427/180; 427/446; 427/248.1; 427/376.6
(58) Field of Classification Search .................. 428/472, 428/610, 633, 678, 937; 427/376.6, 596
   See application file for complete search history.

(56) References Cited

U.S. PATENT DOCUMENTS

| 4,321,311 A | 3/1982 | Strangman |
| 4,405,660 A | 9/1983 | Ulion et al. |
| 4,585,481 A | 4/1986 | Gupta et al. |
| 4,753,902 A | 6/1988 | Ketcham |
| 5,087,477 A | 2/1992 | Giggins, Jr. et al. |
| 5,262,245 A | 11/1993 | Ulion et al. |
| 6,025,048 A | 2/2000 | Cutler et al. |
| 6,071,628 A * | 6/2000 | Seals et al. ............. 428/610 |
| 6,620,525 B1 | 9/2003 | Rigney et al. |
| 6,733,907 B2 | 5/2004 | Morrison et al. |
| 2003/0207031 A1 | 11/2003 | Strangman et al. |
| 2005/0014010 A1 * | 1/2005 | Dumm et al. .............. 428/472 |

FOREIGN PATENT DOCUMENTS

| JP | 2003-342751 A | 12/2003 |
| WO | 01/43965 A1 | 6/2001 |

OTHER PUBLICATIONS

European Search Report for EP Patent Application No. 06252943.3.

\* cited by examiner

*Primary Examiner* — Dah-Wei Yuan  
*Assistant Examiner* — Andrew Bowman  
(74) *Attorney, Agent, or Firm* — Bachman & LaPointe, P.C.

(57) ABSTRACT

A method for reducing thermal conductivity in thermal barrier coatings broadly includes the steps of depositing a mixture containing a ceramic matrix and a metallic dispersant capable of forming a metal oxide upon a substrate to form one or more layers; and heating the layers at a temperature and for a time sufficient to oxidize the metallic dispersant and form one or more layers of a thermal barrier coating.

17 Claims, No Drawings

REDUCED THERMAL CONDUCTIVITY THERMAL BARRIER COATING BY ELECTRON BEAM-PHYSICAL VAPOR DEPOSITION PROCESS

CROSS-REFERENCE TO RELATED APPLICATION

This is a divisional application of Ser. No. 11/149,054, filed Jun. 8, 2005, and entitled REDUCED THERMAL CONDUCTIVITY THERMAL BARRIER COATING BY ELECTRON BEAM-PHYSICAL VAPOR DEPOSITION PROCESS, the disclosure of which is incorporated by reference herein in its entirety as if set forth at length.

BACKGROUND

The disclosure relates to a method for reducing thermal conductivity in thermal barrier coatings and, more particularly, the disclosure relates to a method of reducing thermal conductivity of thermal barrier coatings by incorporating metal oxides into the ceramic matrix.

Gas turbine engines are well developed mechanisms for converting chemical potential energy, in the form of fuel, to thermal energy and then to mechanical energy for use in propelling aircraft, generating electrical power, pumping fluids, etc. At this time, the major available avenue for improved efficiency of gas turbine engines appears to be the use of higher operating temperatures. However, the metallic materials used in gas turbine engines components are currently very near the upper limits of their thermal stability. In the hottest portion of modern gas turbine engines, metallic materials are used at gas temperatures above their melting points. They survive because they are air cooled. But providing air cooling reduces engine efficiency.

Accordingly, there has been extensive development of thermal barrier coatings for use with cooled gas turbine aircraft hardware. By using a thermal barrier coating, the amount of cooling air required can be substantially reduced, thus providing a corresponding increase in efficiency.

One common thermal barrier coating (TBC) consists of a yttria stabilized zirconia ceramic known as 7YSZ. 7YSZ coatings typically exhibit thermal conductivity values of approximately 1 W/m° C. to 1.9 W/m° C., depending upon the process used to deposit the coating. It would be preferable to reduce this thermal conductivity by 50% or more without substantially increasing the mass of the coating. Because coatings are often applied to the airfoils of rotating parts, and assuming no substantial change is coating thickness occurs as a result, small increases in the density of the coating can result in large forces being applied to the rotating part. Therefore, an ideal coating would couple reduced thermal conductivity with reduced mass.

SUMMARY

A method for reducing thermal conductivity in thermal barrier coatings broadly comprises depositing a mixture broadly comprising a ceramic matrix and a metallic dispersant capable of forming a metal oxide upon a substrate to form one or more layers; and heating one or more layers at a temperature and for a time sufficient to oxidize the metallic dispersant and form one or more layers of a thermal barrier coating.

A thermal barrier coating broadly comprises a ceramic matrix; and a metal oxide dispersed throughout the ceramic matrix.

A part having one or more layers of a thermal barrier coating broadly comprises a part; and one or more layers of a thermal barrier coating broadly comprising a ceramic matrix and a metal oxide dispersed throughout the ceramic matrix.

The details of one or more embodiments are set forth in the accompanying drawings and the description below. Other features, objects, and advantages will be apparent from the description and drawings, and from the claims.

BRIEF DESCRIPTION OF THE DRAWINGS

The present application does not contain a drawing.

DETAILED DESCRIPTION

The method(s) disclosed herein create a thermal barrier coating (TBC) with a reduced thermal conductivity resulting from the incorporation of a metal oxide in a ceramic matrix. The metal oxide is a stable oxide exhibiting refractory characteristics and forms within the ceramic matrix by the oxidation of a metallic dispersant. In particular, the TBC described herein is achieved through the co-evaporation of the metallic dispersant with the ceramic matrix onto a part to be coated. The co-evaporation step encompasses evaporating a mixture of the ceramic material and metallic dispersant, or simultaneously evaporating two separate sources of ceramic matrix and metallic dispersant, or evaporating and depositing each material in separate steps. Heat treatment of the co-evaporated deposition results in the oxidation of the metallic dispersant leaving behind a refractory metal oxide within the ceramic matrix. It is believed the resulting TBC exhibits both a lowered thermal conductivity and improved strain tolerance.

The ceramic matrix may consist of any ceramic material useful in thermal barrier coatings. Representative ceramic matrices may include, but are not limited to, oxide, carbide, boride, nitride and silicide based ceramics, and salts of acids such as hafnate and zirconate based ceramics. Suitable oxide based ceramic matrices include, but are not limited to, silica, ceria, lanthania, scandia, hafnia, zirconia and the like. Zirconate based ceramics and zirconia based ceramics are preferably stabilized with a material such as yttria, with yttria stabilized zirconia being a preferred ceramic matrix. Yttria stabilized zirconia is commercially available as 7YSZ.

As noted above, the method of the present invention involves the co-evaporation of a "matrix" TBC oxide along with a metallic dispersant in a predetermined ratio. Subsequent to co-evaporation, a post-coating, alloy friendly, oxidation heat treatment is used to oxidize the metallic dispersant and create the refractory oxide within the ceramic matrix. By "alloy friendly" it is meant that the maximum temperature at which the heat treatment is performed is below the melting temperature of the alloy from which the coated part is created. Preferably, the maximum temperature at which the heat treatment is performed is below the incipient melting point of any and all portions of the coated part exposed to the heat treatment, and below a temperature and/or time at which any undesirable grain growth would occur. For the heat treatment of parts composed of nickel based alloys, maximum heat treatment temperatures typically range from 1750° F. to 2100° F.

It is required that the metallic dispersant be predominately stable in the deposition environment. The resultant refractory metal oxide must be compatible with the ceramic matrix and the processing temperatures typical of EB-PVD coatings. By "compatible" it is meant that the metal disperses within the ceramic matrix and remains stable throughout processing, and successfully converts into a stable metal oxide possessing refractory characteristics after post processing. While the present disclosure is therefore broadly drawn to encompass any and all compatible metallic dispersants, suitable metallic dispersants under typical post-coating heat exposure conditions encompass any metal that forms a stable oxide possessing refractory characteristics within a ceramic matrix, such as but not limited to zirconium and the like.

In practice, both the ceramic matrix and the metallic dispersant are deposited in one or more layers upon the part to be coated. Preferably, the ceramic matrix and the metallic dispersant are deposited through a process of electron beam physical vapor deposition (EB-PVD). It is contemplated that various methods may be employed to achieve the deposition of the ceramic matrix and the metallic dispersant in desired proportions. In one embodiment, particulate ceramic and a solid piece of metallic dispersant may be utilized.

In another embodiment, preformed ingots of the ceramic matrix and the metallic dispersant may be utilized as the source of the coating vapor. In yet another embodiment, a single ingot composed of both the ceramic matrix and metallic dispersant mixed in a predetermined ratio may be vaporized and applied to coat a part forming a coating consisting of a similarly predetermined ratio of ceramic matrix material to metallic dispersant material.

The resulting deposited TBC may comprise one or more layers of a ceramic matrix oxide and a refractory metal oxide dispersed therein. Each individual layer may contain a different percentage mixture of ceramic matrix oxide and refractory metal oxide resulting in a predetermined post-heating strain tolerance. In one embodiment, there may be alternatingly deposited upon the part one or more layers containing the metallic dispersant and one or more layers without the metallic dispersant. As a result, post heat treatment, the resulting TBC contains one or more layers containing the refractory metal oxide that exhibit a desirable level of cracking and possess a higher strain tolerance than one or more layers containing the ceramic matrix alone.

The amount of cracking and increased strain tolerance within a layer and the TBC overall may be controlled by varying the ratio of metallic dispersant to ceramic matrix material evaporated in the co-evaporation step. Microstructures, such as continuously porous or graded porosity coatings can also be produced. To produce graded porosity coatings, multi-source EB-PVD is performed whereby the intensity of the electron beam used to vaporize the metallic dispersant material may be varied in accordance with the desired amount of gradation. When employing a dual- or multi-source coating process, the initial and final layers of the deposited TBC may be of higher density or different composition then the ceramic matrix (depending on the number of evaporation sources employed) to further enhance the characteristics of the resultant TBC system. For example, selection of different material layers to optimize oxidation resistance, TBC adherence and erosion/impact resistance is also possible. Such material layers may consist of, but are not limited to, yttria-stabilized zirconia, fully stabilized gadolinia zirconia, pyrochlores, alumina, and combinations thereof.

One or more embodiments have been described. Nevertheless, it will be understood that various modifications may be made. Accordingly, other embodiments are within the scope of the following claims.

What is claimed is:

1. A method for reducing thermal conductivity in thermal barrier coatings, comprising:
   depositing a mixture comprising a ceramic matrix and a metallic dispersant capable of forming a metal oxide upon a substrate to form one or more layers, the depositing comprising vaporizing the ceramic matrix and the metallic dispersant; and
   heating said one or more layers at a temperature and for a time sufficient to oxidize said metallic dispersant and form one or more layers of a thermal barrier coating.

2. The method of claim 1, wherein the depositing of the mixture involves vapor codepositing from separate preformed sources of the ceramic matrix and the metallic dispersant.

3. The method of claim 1, wherein the vaporizing is an electron beam physical vapor deposition process.

4. The method of claim 3, wherein the depositing said mixture comprises utilizing a particulate ceramic matrix and a particulate metallic dispersant.

5. The method of claim 3, wherein the vaporizing comprises vaporizing an ingot of said ceramic matrix and vaporizing an ingot of said metallic dispersant.

6. The method of claim 3, wherein the vaporizing comprises vaporizing a target comprised of an approximately uniform distribution of said ceramic matrix and said metallic dispersant.

7. The method of claim 1, wherein the heating comprises heating said one or more layers wherein said temperature is lower than the incipient melting point of said substrate.

8. The method of claim 1, wherein the heating comprises heating said one or more layers at a temperature of about 1750° F. to 2100° F.

9. The method of claim 8, wherein the heating comprises heating said one or more layers at a temperature and for a time sufficient to oxidize 90% or more of said metallic dispersant.

10. The method of claim 1, wherein said mixture is a first mixture, the method further comprising depositing one or more layers of a ceramic mixture as a second mixture substantially free of any metallic dispersant capable of forming said metal oxide alternatingly interspersed with the one or more layers formed by said depositing said first mixture.

11. The method of claim 10, wherein the depositing said second mixture comprises electron beam physical vapor deposition of said second mixture.

12. The method of claim 1, wherein the depositing said first mixture comprises depositing said mixture upon a gas turbine engine component.

13. The method of claim 1, wherein said ceramic matrix is selected from the group consisting of oxides, borides, carbides, nitrides, silicides and salts of acids.

14. The method of claim 1, wherein said ceramic matrix is an oxide selected from the group consisting of silica, ceria, lanthania, scandia, hafnia and stabilized zirconia.

15. The method of claim 1, wherein said ceramic matrix is a salt of an acid selected from the group consisting of hafnates and zirconates.

16. The method of claim 1, wherein said ceramic matrix is a yttria stabilized zirconia or a yttria stabilized zirconate.

17. The method of claim 1, wherein said metal oxide is zirconium oxide.

* * * * *